(12) United States Patent
Goyal et al.

(10) Patent No.: US 6,983,243 B1
(45) Date of Patent: Jan. 3, 2006

(54) METHODS AND APPARATUS FOR WIRELESS TRANSMISSION USING MULTIPLE DESCRIPTION CODING

(75) Inventors: Vivek K. Goyal, Hoboken, NJ (US); Jelena Kovacevic, New York, NY (US); Francois Masson, Monthey (CH)

(73) Assignee: Lucent Technologies Inc., Murray Hill, NJ (US)

( * ) Notice: Subject to any disclaimer, the term of this patent is extended or adjusted under 35 U.S.C. 154(b) by 798 days.

(21) Appl. No.: 09/698,437

(22) Filed: Oct. 27, 2000

(51) Int. Cl.
*G10L 19/22* (2006.01)
*H04B 1/69* (2006.01)
*H04B 7/02* (2006.01)

(52) U.S. Cl. ............... 704/222; 375/132; 375/267
(58) Field of Classification Search ........... 704/222; 370/228, 477, 465, 470, 473, 474, 476, 480; 375/265, 267, 280, 132, 133, 135, 137
See application file for complete search history.

(56) References Cited

U.S. PATENT DOCUMENTS

| 5,048,057 A | * | 9/1991 | Saleh et al. ............. 375/267 |
| 5,629,940 A | * | 5/1997 | Gaskill ................. 340/7.35 |
| 5,748,669 A |   | 5/1998 | Yada .................... 375/135 |
| 5,812,522 A | * | 9/1998 | Lee et al. .............. 342/457 |
| 5,887,023 A | * | 3/1999 | Mabuchi ................ 370/204 |
| 6,058,137 A |   | 5/2000 | Partyka |
| 6,185,258 B1 | * | 2/2001 | Alamouti et al. ......... 375/260 |

FOREIGN PATENT DOCUMENTS

| EP | 0 856 956 | 8/1998 |
| WO | WO 98/27663 | 6/1998 |
| WO | WO 01/86887 | 11/2001 |

OTHER PUBLICATIONS

Fleming, Michael, et al., "Generalized Multiple Description Vector Quantization," Mar. 1999, Data Compression Conference, IEEE Computer Society, p. 3-12.*

Yang, Shih-Ming, et al., "Low-Delay Communication for Rayleigh Fading Channels: An Application of the Multiple Description Quantizer," IEEE Transactions on Communications, vol. 43, No. 11, Nov. 1995, p. 2771-2783.*

(Continued)

*Primary Examiner*—Richemond Dorvil
*Assistant Examiner*—V. Paul Harper (57) ABSTRACT

A multiple description coder generates a number of different descriptions of a given portion of a signal in a wireless communication system, using multiple description scalar quantization (MDSQ) or another type of multiple description coding. The different descriptions of the given portion of the signal are then arranged into packets such that at least a first description of the given portion is placed in a first packet and a second description is placed in a second packet. Each of the packets are then transmitted using a frequency hopping modulator, and the hopping rate of the modulator is selected or otherwise configured based at least in part on the number of descriptions generated for the different portions of the signal. For example, in an embodiment in which two descriptions are generated for each portion of the signal, a first description for a current one of the portions of the signal is placed in a current packet along with a second one of the descriptions for a previous portion of the signal, and the frequency hopping rate of the modulator is doubled relative to a hopping rate used for single description transmission.

20 Claims, 4 Drawing Sheets

OTHER PUBLICATIONS

Sherwood, P. Greg, et al., "Efficeint Image and Channel Coding for Wireless Packet Networks," Proceedings 2000 International Conference on Image Processing, Sep. 2000, p. 132-135, vol. 2.*

V.A. Vaishampayan et al., "Balanced Interframe Multiple Description Video Compression," IEEE, pp. 812-816, 1999.

V.A. Vaishampayan, "Design of Multiple Description Scalar Quantizers," IEEE Trans. Inform. Th., 39(3), pp. 821-834, May 1993.

V.A. Vaishampayan et al., "Design of Entropy-Constrained Multiple-Description Scalar Quantizers," IEEE Trans. Inform. Th., 40(1), pp. 245-250, Jan. 1994.

V.A. Vaishampayan et al., "Asymptotic Analysis of Multiple Description Quantizers," IEEE Trans. Inform. Th., 21 pages, 1994.

A. Ingle et al., "DPCM System Design for Diversity Systems with Applications to Packetized Speech," IEEE Trans. Sp. and Audio Proc., 3(1), pp. 48-57, Jan. 1995.

V.A. Vaishampayan, "Application of Multiple Description Codes to Image and Video Transmission over Lossy Networks," 7th Int'l Workshop on Packet Video, 18-19, 6 pages, Mar. 1996, Brisbane, Australia.

* cited by examiner

|     | 1 | 2  | 3  | 4  | 5  | 6 | 7 | 8 |
|-----|---|----|----|----|----|---|---|---|
| 1   | 8 | 9  |    |    |    |   |   |   |
| 2   |   | 10 | 11 |    |    |   |   |   |
| 3   |   |    | 12 | 13 |    |   |   |   |
| 4   |   |    |    | 14 | 15 |   |   |   |
| 5   |   |    |    |    | 1  | 2 |   |   |
| 6   |   |    |    |    |    | 3 | 4 |   |
| 7   |   |    |    |    |    |   | 5 | 6 |
| 8   |   |    |    |    |    |   |   | 7 |

(rows indexed by $i_2$, columns indexed by $i_1$)

FIG. 3B

| $i_1$ | $|I(k)|$ | DS | DLN | DQS | DQLN | OUTPUT | $W[|I(k)|]$ | $F[|I(k)|]$ | *i |
|---|---|---|---|---|---|---|---|---|---|
| 1 | 8 | 1 | 400–2047 | 1 | 425 | 3.32 | 70.13 | 7 | 8 |
| 2 | 9–10 | 1 | 300–399 | 1 | 348 | 2.72 | 14.31 | 3 | 10 |
| 3 | 11–12 | 1 | 178–299 | 1 | 243 | 1.90 | 4.56 | 1 | 12 |
| 4 | 13–14 | 1 | 3972–4095 0–177 | 1 | 69 | 0.54 | 1.38 | 0 | 14 |
| 5 | 15<br>1<br>1 | 0/1<br>0<br>0 | 2048–3971<br>3972–4096<br>0–79 | 0 | 4 | 0.031 | −0.75 | 0 | 15 |
| 6 | 2–3 | 0 | 80–245 | 0 | 174 | 1.36 | 2.81 | 1 | 2 |
| 7 | 4–5 | 0 | 246–348 | 0 | 298 | 2.33 | 8.06 | 1 | 4 |
| 8 | 6–7 | 0 | 349–2047 | 0 | 399 | 3.12 | 31.75 | 6 | 6 |

FIG. 3C

| $i_2$ | $|I(k)|$ | DS | DLN | DQS | DQLN | OUTPUT | $W[|I(k)|]$ | $F[|I(k)|]$ | *i |
|---|---|---|---|---|---|---|---|---|---|
| 1 | 8–9 | 1 | 349–2047 | 1 | 399 | 3.12 | 31.71 | 6 | 9 |
| 2 | 10–11 | 1 | 246–348 | 1 | 298 | 2.33 | 8.06 | 1 | 11 |
| 3 | 12–13 | 1 | 80–245 | 1 | 174 | 1.36 | 2.81 | 1 | 13 |
| 4 | 14<br>14<br>15 | 1<br>1<br>0/1 | 3972–4095<br>0–79<br>2048–3971 | 1 | 4 | 0.031 | −0.75 | 0 | 15 |
| 5 | 1–2 | 0 | 3972–4095 0–177 | 0 | 69 | 0.54 | 1.38 | 0 | 1 |
| 6 | 3–4 | 0 | 178–299 | 0 | 243 | 1.90 | 4.56 | 1 | 3 |
| 7 | 5–6 | 0 | 300–399 | 0 | 348 | 2.72 | 14.31 | 3 | 5 |
| 8 | 7 | 0 | 400–2047 | 0 | 425 | 3.32 | 70.13 | 7 | 7 |

FIG. 4A

|     | $i_2$ |   |   |   |
|-----|---|---|---|---|
| $i_1$ | 1 | 2 | 3 | 4 |
| 1   | 8 | 9 |   |   |
| 2   | 10| 11|   |   |
| 3   | 12| 13|   |   |
| 4   | 14| 15|   |   |
| 5   |   |   | 1 |   |
| 6   |   |   | 2 | 3 |
| 7   |   |   | 4 | 5 |
| 8   |   |   | 6 | 7 |

FIG. 4B

| $i_1$ | $|I(k)|$ | DS | DLN | DQS | DQLN | OUTPUT | $W[|I(k)|]$ | $F[|I(k)|]$ | *i |
|---|---|---|---|---|---|---|---|---|---|
| 1 | 8-9 | 1 | 349-2047 | 1 | 399 | 3.12 | 31.75 | 6 | 9 |
| 2 | 10-11 | 1 | 246-348 | 1 | 298 | 2.33 | 8.06 | 1 | 11 |
| 3 | 12-13 | 1 | 80-245 | 1 | 174 | 1.36 | 2.81 | 1 | 13 |
| 4 | 14<br>14<br>15 | 1<br>1<br>0/1 | 3972-4095<br>0-79<br>2048-3971 | 1 | 4 | 0.031 | -0.75 | 0 | 15 |
| 5 | 1<br>1 | 0<br>0 | 3972-4096<br>0-79 | 0 | 4 | 0.031 | 1.13 | 0 | 1 |
| 6 | 2-3 | 0 | 80-245 | 0 | 174 | 1.36 | 2.81 | 1 | 2 |
| 7 | 4-5 | 0 | 246-348 | 0 | 298 | 2.33 | 8.06 | 1 | 4 |
| 8 | 6-7 | 0 | 349-2047 | 0 | 399 | 3.12 | 31.75 | 6 | 6 |

FIG. 4C

| $i_1$ | $|I(k)|$ | DQS | DQLN | OUTPUT | $W[|I(k)|]$ | $F[|I(k)|]$ | *i |
|---|---|---|---|---|---|---|---|
| 1 | 8, 10, 12, 14 | 1 | 241 | 1.88 | 7.5 | 2 | 12 |
| 2 | 9, 11, 13, 15 | 1 | 195 | 1.52 | 3.44 | 1 | 13 |
| 3 | 1, 2, 4, 6 | 0 | 176 | 1.38 | 3.44 | 1 | 2 |
| 4 | 3, 5, 7 | 0 | 320 | 2.5 | 7.5 | 2 | 3 |

*FIG. 5*

METHODS AND APPARATUS FOR WIRELESS TRANSMISSION USING MULTIPLE DESCRIPTION CODING

FIELD OF THE INVENTION

The present invention relates generally to multiple description (MD) coding of data, speech, audio, images, video and other types of signals, and more particularly to wireless transmission techniques for use in conjunction with MD coding of signals.

BACKGROUND OF THE INVENTION

Multiple description (MD) coding is a source coding technique in which multiple bit streams are used to describe a given source signal. Each of these bit streams represents a different description of the signal, and the bit streams can be decoded separately or in any combination. Each bit stream may be viewed as corresponding to a different transmission channel subject to different loss probabilities. The goal of MD coding is generally to provide a signal reconstruction quality that improves as the number of received descriptions increases, without introducing excessive redundancy between the descriptions.

By way of example, two-description MD coding is characterized by two descriptions having rates $R_1$ and $R_2$ and corresponding single-description reconstruction distortions $D_1$ and $D_2$, respectively. The single-description distortions $D_1$ and $D_2$ are also referred to as side distortions. The distortion resulting from reconstruction of the original signal from both of the descriptions is designated $D_0$ and referred to as the central distortion. Similarly, the corresponding single-description and two-description decoders are called side and central decoders, respectively. A balanced two-description MD coding technique refers to a technique in which the rates $R_1$ and $R_2$ are equal and the expected values of the side distortions $D_1$ and $D_2$ are equal.

A well-known MD coding approach known as MD scalar quantization (MDSQ) is described in V. A. Vaishampayan, "Design of multiple description scalar quantizers," IEEE Transactions on Information Theory, Vol. 39, No. 3, pp. 821–834, May 1993, which is incorporated by reference herein. In an example of two-description MDSQ, a given signal sample is quantized using two different scalar quantizers, and each quantizer output is transmitted on a corresponding one of two different channels. If either channel is received by itself, the original signal sample value is known within a given quantization cell of that channel. If both channels are received, the original value is known within the intersection of its quantization cell in one channel and its quantization cell in the other. In this manner, an MDSQ system provides coarse information to side decoders and finer information to a central decoder.

Although these and other MD coding techniques are well known in the art, a need nonetheless exists for improvements in the implementation of MD coding in practical applications, particularly in wireless communication system applications such as frequency hopping wireless systems.

SUMMARY OF THE INVENTION

The present invention provides improved wireless transmission techniques for use in conjunction with multiple description (MD) coding.

In accordance with one aspect of the invention, a multiple description coder generates a number of different descriptions of a given portion of a signal in a wireless communication system, using multiple description scalar quantization (MDSQ) or another type of multiple description coding. The different descriptions of the given portion of the signal are then arranged into packets such that at least a first description of the given portion is placed in a first packet and a second description of the given portion is placed in a second packet. Each of the packets are then transmitted using a frequency hopping modulator, and the hopping rate of the modulator is selected or otherwise configured based at least in part on the number of descriptions generated for the different portions of the signal.

By way of example, in an illustrative embodiment of the invention in which two descriptions are generated for each portion of the signal, a first description for a current one of the portions of the signal is placed in a current packet along with a second one of the descriptions for a previous portion of the signal. The packet size for the first and second packets is selected as one-half a packet size used for transmission of a single description of the given portion of the signal, and the frequency hopping rate of the modulator is doubled relative to a hopping rate used for single description transmission.

Advantageously, the present invention in the illustrative embodiment does not increase the transmission delay of the system, due to the doubling of the frequency hopping rate. In addition, sending the descriptions for a given portion of the signal in two different packets prevents the loss of both descriptions if only a single packet is lost.

The techniques of the invention are particularly well-suited for use in applications such as cordless telephones, but can also be used in other types of wireless systems. In addition, the techniques of the invention are suitable for use in conjunction with signal transmission over many different types of channels, including lossy packet networks such as the Internet as well as broadband ATM networks, and may be used with data, speech, audio, images, video and other types of signals.

DETAILED DESCRIPTION OF THE INVENTION

The invention will be illustrated below in conjunction with exemplary communication systems which incorporate multiple description (MD) coding. It should be understood that the techniques described may be applied to transmission of a wide variety of different types of signals, including data signals, speech signals, audio signals, image signals, and video signals, in either compressed or uncompressed formats. The term "channel" as used herein refers generally to any type of communication medium for conveying at least a portion of an encoded signal, and is intended to include a packet or a group of packets. The term "packet" is intended to include any portion of an encoded signal suitable for transmission as a unit over a network or other type of communication medium.

Figure 1:
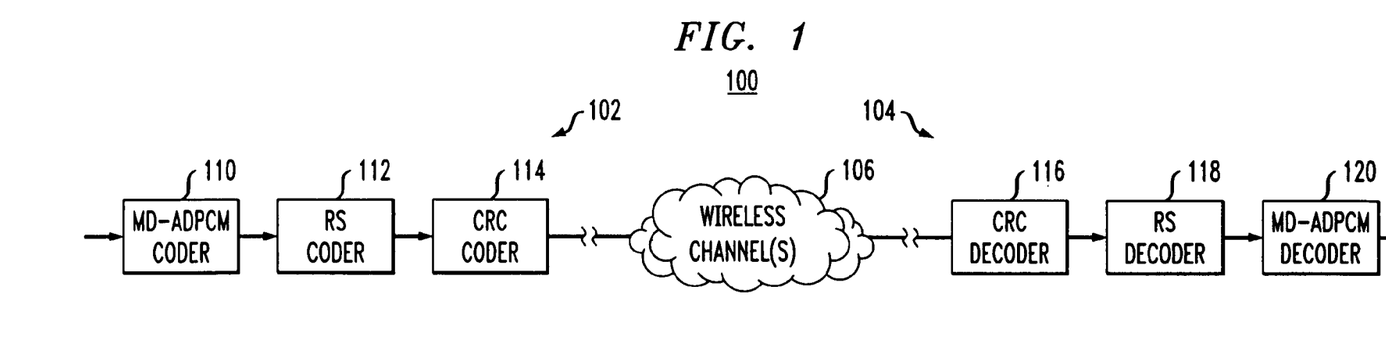
FIG. 1 shows an exemplary wireless communication system in accordance with an illustrative embodiment of the invention.

FIG. 1 shows a wireless communication system 100 configured in accordance with an illustrative embodiment of the invention. The system 100 includes a transmitter 102 and a receiver 104 which communicate over one or more wireless channels 106. The transmitter 102 in this illustrative embodiment includes a multiple description-adaptive differential pulse code modulation (MD-ADPCM) coder 110, a Reed-Solomon (RS) coder 112, and a cyclic redundancy check (CRC) coder 114. The receiver 104 includes a CRC decoder 116, an RS decoder 118, and an MD-ADPCM decoder 120, which elements perform operations complementary to those performed by the corresponding elements of the transmitter 102.

In operation, an analog signal to be transmitted through system 100 is sampled and the resulting samples are applied to an input of the MD-ADPCM coder 110. It may be assumed without limitation that the input signal is an audio signal, such as a speech signal generated in a cordless telephone application of the system 100. As noted previously, the invention is applicable to a wide variety of other types of signals. The MD-ADPCM coder 110 generates multiple description bit streams from the signal samples in a manner to be described in greater detail below. The multiple description bit streams are then encoded in coders 112 and 114 for transmission through the wireless channel(s) 106 to the receiver 104. The receiver 104 performs CRC and RS decoding of the received bit streams, and applies the resulting outputs to the MD-ADPCM decoder 120 to reconstruct the original signal samples.

The system 100 is simplified for purposes of clarity of illustration, and may include elements not shown in FIG. 1, such as modulators, demodulators, filters, signal converters, etc. It should also be understood that the arrangement of elements shown in FIG. 1 is by way of example only. The MD coding techniques of the invention may be implemented using many other types and arrangements of elements, as will be apparent to those skilled in the art. For example, it will be appreciated that the invention does not require use of ADPCM.

Figure 2:
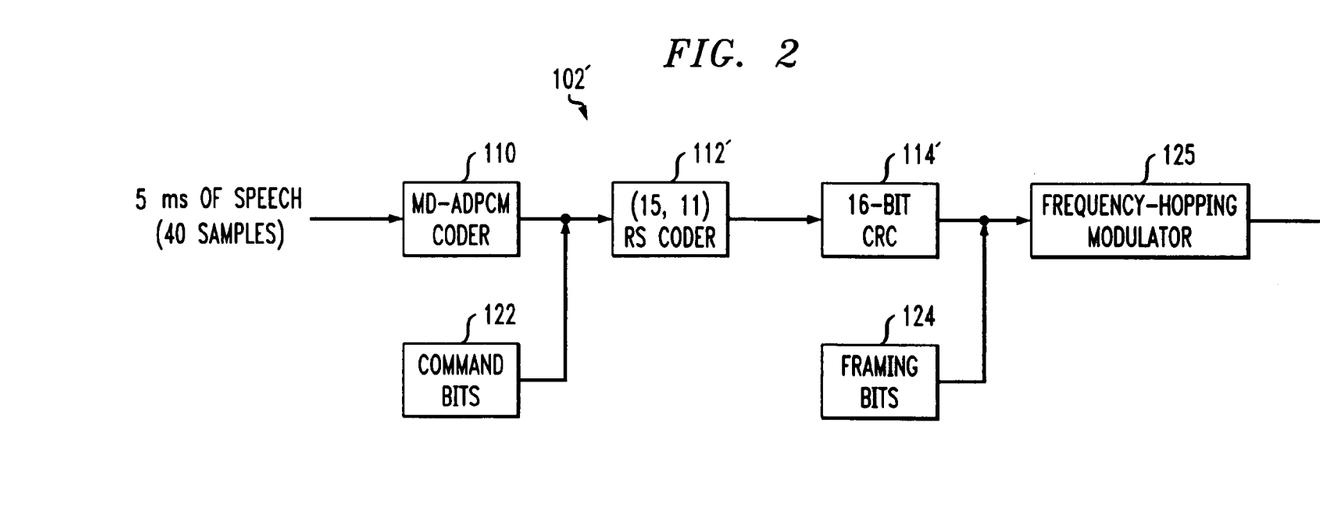
FIG. 2 shows a more detailed example of a transmitter portion of the system of FIG. 1 in one application of the present invention.

FIG. 2 shows a more detailed example of a transmitter 102' suitable for use in the system 100. In this example, the transmitter 102' includes the MD-ADPCM coder 110, a (15,11) RS coder 112' and a 16-bit CRC coder 114'. A given packet of audio information applied to the input of the MD-ADPCM coder 110 in this example includes 5 milliseconds of speech, sampled at a rate of 8 kHz, for a total of 40 consecutive samples. The transmitter 102' further adds a number of command bits 122 to the output of the MD-ADPCM coder 110, and a number of framing bits 124 to the output of the 16-bit CRC coder 114'. The particular numbers of command and framing bits per packet are dependent upon the specific implementation of the system, and may be determined in a straightforward manner.

In the illustrative embodiment as shown in FIGS. 1 and 2, it is assumed without limitation that the MD-ADPCM coder 110 is implemented as a modification of an otherwise conventional single description G.726 coder as described in International Telegraph and Telephone Consultative Committee (CCITT) Recommendation G.726, "40, 32, 24, 16 kbit/s Adaptive Differential Pulse Code Modulation (AD-PCM)," December 1990, which is incorporated by reference herein. An unmodified conventional single description G.726 coder in the FIG. 2 example would encode each of the 40 consecutive samples of a given 5 millisecond speech segment using 4 bits, and thus operates at a bit rate of 32 kbit/s. The operation of the single description G.726 ADPCM coder is well understood in the art, and described in detail in the above-cited reference, and will therefore not be further described herein.

The operation of the conventional single description ADPCM coder is modified in the illustrative embodiment so as to produce multiple descriptions of each input sample. As a result, the coder uses additional bits and operates with a higher coding rate. In the particular implementations to be described in conjunction with FIGS. 3 and 4 below, the resulting MD-ADPCM coder bit rates are 48 kbit/s and 40 kbit/s, respectively. The multiple descriptions in these implementations of the illustrative embodiment are generated using MD scalar quantization (MDSQ) techniques of a type similar to that described in the above-cited V. A. Vaishampayan reference.

The transmitter 102' of FIG. 2 further includes a frequency hopping modulator 125. The modulator 125 modulates the coded bit streams from CRC coder 114' onto a carrier frequency for transmission over the wireless channel(s) 106. The frequency hopping is used to introduce diversity into the transmission, and is preferably periodic. For example, consecutive packets may be sent on one of 25 different frequencies $\{f_n\}$, where n=1, 2, . . . 25. More particularly, a given packet n+25·p may be sent on the nth frequency $f_n$, where $p \geq 0$ is an index denoting a particular frequency hopping period.

An aspect of the present invention involves selection of a frequency hopping rate for the modulator 125 so as to support the transmission of the multiple descriptions generated by the MD-ADPCM coder. This aspect of the invention will be described in greater detail in conjunction with FIG. 5.

Figure 3A:
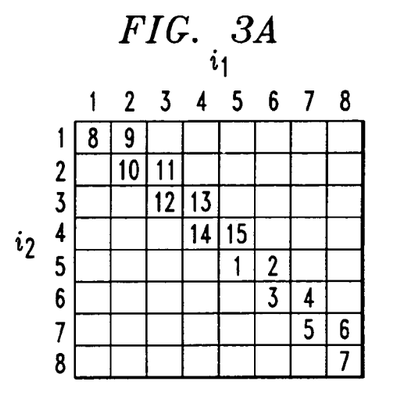
FIGS. 3A, 3B and 3C illustrate operating parameters of a first example implementation of a multiple description (MD) coder in accordance with the invention.
Figure 3B:
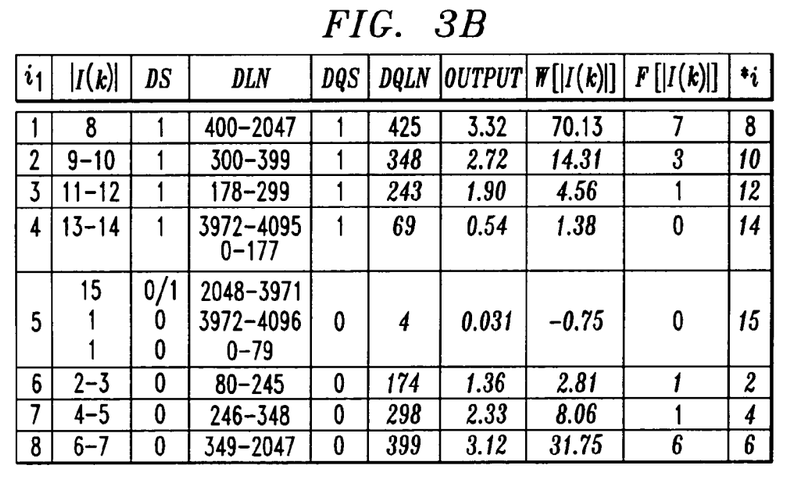
Figure 3C:
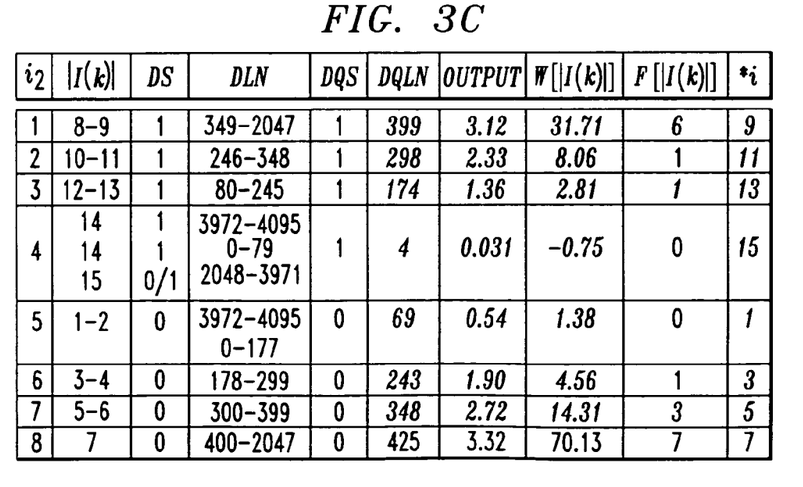

FIGS. 3A, 3B and 3C illustrate operating parameters of the MD-ADPCM coder and decoder in a 48 kbit/s implementation of the illustrative embodiment. In the above-noted 32 kbit/s conventional single description ADPCM coder, a 15-level quantizer is used to quantize a prediction error d(k) for each input sample, as described in the above-cited G.726 Recommendation, and a 4-bit index is used to specify each of the resulting quantization levels. The multiple descriptions of the present invention are generated using the output of the 15-level quantizer and an index assignment table. In this implementation, two descriptions of 3 bits each are generated for every input sample, such that a total of 6 bits are generated for each sample, rather than the 4 bits used in the single description case. This increases the bit rate of the coder from the single description baseline of 32 kbit/s to a multiple description rate of 48 kbit/s.

FIG. 3A shows an index assignment table for the 48 kbit/s implementation. In the table, $i_1$ is the index of the first description, and $i_2$ is the index of the second description. The values in the cells of the table are the indices of the 15 different levels of the above-noted 15-level quantizer. The levels are arranged in the table using 3-bit two's complement notation, such that 8<9< . . . <14 <15<1<2< . . . <6<7.

In operation, the above-noted 15-level quantizer generates a particular 4-bit index corresponding to a level associated with the current input sample. That value is used in the MD-ADPCM decoder 110 to determine the index values for the first and second descriptions using an index assignment table, such as the index assignment table of FIG. 3A. For example, if the 15-level quantizer generates as an output the 4-bit index for level 15, the first and second descriptions will be 5 and 4, respectively, as determined from the FIG. 3A table. In the receiver 104, if both descriptions 5 and 4 are correctly received, the MD-ADPCM decoder uses the index assignment table of FIG. 3A to determine that the quantizer level for the sample is level 15. Therefore, when both descriptions are received, the performance is the same as that resulting in the single description case with correct receipt of the single description. If only one of the descriptions 5 and 4 are received the MD-ADPCM decoder in the receiver can output a coarse approximation of the input sample. More particularly, if the first description 5 is lost and only the second description 4 is correctly received, the decoder can output a midpoint of the levels 14 and 15. Additional details regarding the operation of MDSQ techniques of this type can be found in the above-cited V. A. Vaishampayan reference.

FIGS. 3B and 3C show quantization and inverse quantization of the prediction error for the first and second descriptions, respectively. In the tables, $i_1$ and $i_2$ again denote the indices of the respective first and second descriptions, $|I(k)|$ is the bin index of the single description 15-level quantizer, DS is the sign of the prediction error, DLN is the inner value of $\log_2 |d(k)| - y(k)$ in 12-bit two's complement notation, DQS is the sign of the output of a corresponding inverse quantizer, and DQLN is the normalized output in 12-bit two's complement notation. DQS and DQLN represent the output of the inverse quantizer when only the first or second description are received in the MD-ADPCM decoder. W and F denote the values used in quantization scale factor adaptation and adaptation speed control blocks, respectively, of the MD-ADPCM coder and decoder. Finally, *i is the value used in synchronous coding adjustment in the MD-ADPCM decoder. It should be noted that the values shown in italics in the tables are selected for the particular implementation, while all other values are specified in the above-cited G.726 Recommendation.

For each description, considered separately, reconstructed values in the inverse quantization were determined for every index of the description. It was determined experimentally that a suitable approach for determining the inverse quantization was to take for a given description an average of the corresponding two reconstructed values of the single description or "fine" quantization. For example, from FIG. 3A it can be seen that for index 7 of the first description, the corresponding two reconstructed values of the fine quantization are 4 and 5. Other parameters in the tables of FIGS. 3B and 3C were determined as follows:

Wt[|I(k)|]=min (fine quantization)+(⅕)·(max−min),

F[|I(k)|]=max (fine quantization), but 6 instead of 7 if the cell of the table corresponds to the two cells in the fine quantization, and

*i=closest index to the center.

Figure 4A:
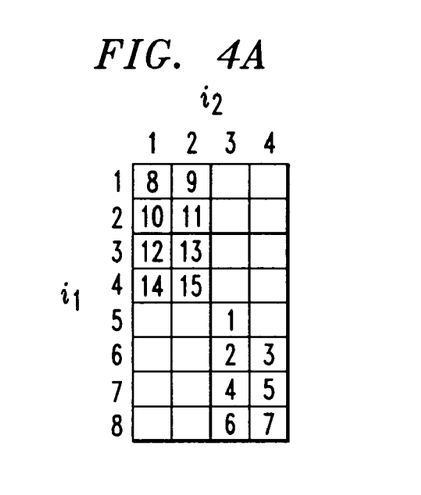
FIGS. 4A, 4B and 4C illustrate operating parameters of a second example implementation of an MD coder in accordance with the invention.
Figure 4B:
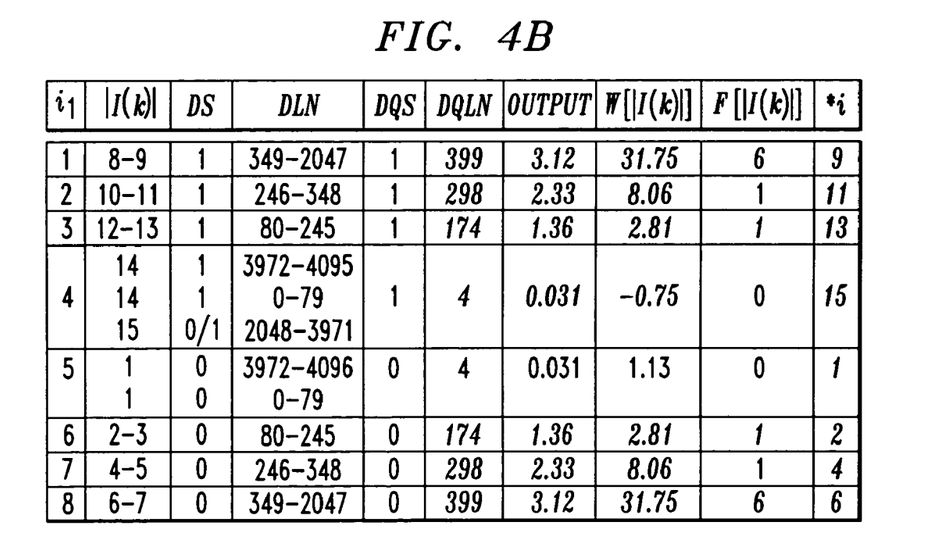
Figure 4C:
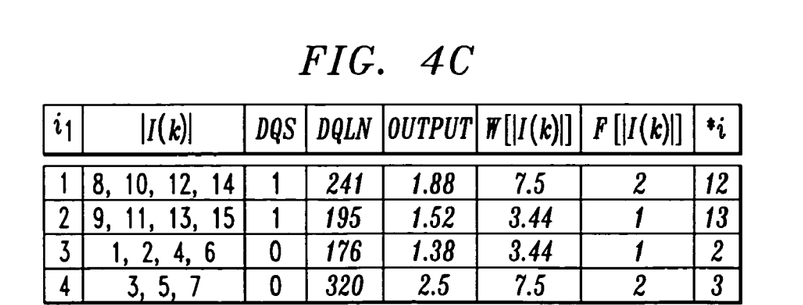

FIGS. 4A, 4B and 4C illustrate operating parameters of the MD-ADPCM coder and decoder in a 40 kbit/s implementation of the illustrative embodiment. In this implementation, first and second descriptions of 2 and 3 bits, respectively, are generated for every input sample. As a result, a total of 5 bits are generated for each sample, rather than the 4 bits used in the single description case. This increases the bit rate of the coder from the single description baseline of 32 kbit/s to a multiple description rate of 40 kbit/s. In order to have a balance in rate and distortion between the descriptions, the index assignment is configured to alternate on a sample-by-sample basis.

FIG. 4A shows an index assignment table for the 40 kbit/s implementation, and FIGS. 4B and 4C show the quantization and inverse quantization of the prediction error for the respective first and second descriptions. The notation in these tables is the same as that previously described in conjunction with FIGS. 3A, 3B and 3C.

For the first description, the inverse quantization is again determined as the average of the two values of the fine quantization. Other parameters shown in the table of FIG. 4B for the first description are determined in the same manner as that previously described in conjunction with FIG. 3B for the first description of the 48 kbit/s implementation.

For the second description, the inverse quantization is determined as the average of the three or four values of the fine reconstruction. By way of example, with reference to the index assignment table of FIG. 4A, if the first description is lost and the received second description is 4, the inverse quantization is determined as an average of the fine quantization levels 3, 5 and 7 associated with the 15-level quantizer. Other parameters for the second description as shown in the table of FIG. 4C are determined as follows:

w[|I(k)|]=second (fine quantization)+(⅕)·(third−second), where the three or four values of the fine quantization are ordered from smallest to largest, F[|I(k)|]=average (fine quantization), and

*i=second closest index to the center.

As noted previously, in the illustrative embodiment as shown in FIG. 2, the frequency hopping modulator 125 periodically hops in frequency. One possible single description implementation of the modulator 125 in a cordless telephone application hops among 25 different frequencies $\{f_n\}$, where n=1, 2, . . . 25, using a hopping period of 125 milliseconds. Each 5 millisecond speech segment in such an application is thus sent in a different packet on a different frequency. The modulator 125 thus cycles through the 25 hopping frequencies in each 125 millisecond hopping period in the single description case.

The present invention provides a multiple description interleaving strategy that involves configuring the frequency hopping rate of the modulator 125 for transmission of the previously-described multiple descriptions. In order to avoid an increase in the transmission delay, the frequency hopping rate used for transmission of the multiple descriptions in the illustrative embodiment is doubled relative to the hopping rate used for the above-noted single description implementation. Consecutive input samples are separated into groups of 20 samples. A given packet is generated using the samples associated with a first description of a current 20-sample group and the samples associated with a second description of the previous 20-sample group. Each packet is still transmitted using a particular one of the 25 frequencies, but the packet is configured in the manner described above to include a first description of a current group of samples and a second description of a previous group of samples. In other words, the first description of the current 20-sample group is sent in the current packet, and the second description is delayed and sent with the next packet. The frequency hopping rate is doubled, such that the frequency hopping period for the illustrative embodiment is reduced to 62.5 milliseconds.

The terms "selecting" or "configuring" as used herein with regard to the configuration of the hopping rate of the frequency hopping modulator should not be construed as requiring the use of a modulator with a selectable hopping rate. These terms are intended more generally to encompass any mechanism or technique for establishing a particular hopping rate for a frequency hopping modulator. For example, although the invention can be used in embodiments in which a frequency hopping modulator has selectable hopping frequencies, it may also be used in embodiments in which the hopping rate is configured during design of the system, based at least in part on the number of descriptions generated in the particular system design, and remains fixed thereafter. The invention thus does not require that a frequency hopping modulator be operable in both a single description and multiple description mode.

Figure 5:
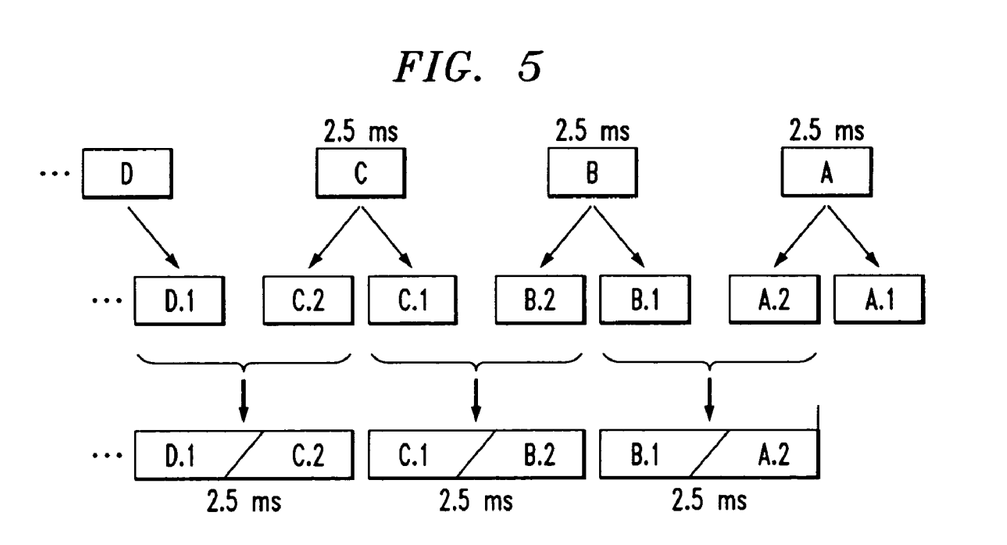
FIG. 5 illustrates an interleaving process implemented in the transmitter of FIG. 2 in accordance with the present invention.

FIG. 5 illustrates the above-described interleaving strategy as implemented using the MD-ADPCM coder 110 and the frequency hopping modulator 125 of FIG. 2. A number of 20-sample groups are shown in the figure and are denoted A, B, C, D, etc. As previously noted, each of the 20-sample groups in the illustrative embodiment corresponds to 2.5 milliseconds of speech. For each of the 20-sample groups, two descriptions are generated using the techniques described previously. These two descriptions are denoted for group A as A.1 and A.2, for group B as B.1 and B.2, and so on. A given 2.5 millisecond packet is generated for a current 20-sample group as a combination of the first description for that group and the second description for the previous 20-sample group. For example, the first description B.1 is grouped with the second description A.2 to form a packet, the first description C.1 is grouped with the second description B.2 to form a packet, the first description D.1 is grouped with the second description C.2, and so on.

Advantageously, the interleaving strategy of the present invention as illustrated in FIG. 5 does not increase the transmission delay of the system, due to the doubling of the frequency hopping rate. In addition, sending the descriptions for a given group of samples in two different packets prevents the loss of both descriptions if only a single packet is lost. More particularly, a single packet loss results in the loss of the first description of the current 20-sample group, and the second description of the previous 20-sample group. The decoder in this situation can use the received descriptions from another packet to generate a coarse approximation of the input samples.

It should be noted that the system operating parameters described in conjunction with FIGS. 3, 4 and 5 above are provided by way of example only, and should not be construed as limiting the scope of the invention in any way. For example, the invention can be implemented using more than two descriptions for a given group of samples, and different frequency hopping arrangements.

The MD coding and interleaving operations described above can be implemented in the illustrative embodiment through appropriate modification of one or more functions of the above-noted conventional single description G.726 ADPCM coder. More particularly, conventional G.726 coder functions as described in the above-cited G.726 recommendation can be modified in the following manner:

1. Function g726_quant. This function performs the quantization of $\log_2 |d(k)| - y(k)$. It can be modified in order to output the two descriptions computed using the index assignment table.

2. Function g726_reconst. This function computes the inverse quantization. It can be modified to implement the following processes:

(a) If both descriptions are input, the index assignment table is used to find the index of the fine quantizer, and this index is used to output the inverse quantization value (DQS and DQLN).
(b) If only one description is input, this description is used to output the corresponding reconstructed values DQS and DQLN given in FIGS. 3B and 3C for the 48 kbit/s implementation or in FIGS. 4B and 4C for the 40 kbit/s implementation.
(c) If no description is input, a zero is output.

3. Function g726_functw. This function implements the function W, and is modified to handle the same three cases described above for the function g726_reconst.

4. Function g726_functf. This function implements the function F, and is modified to handle the same three cases described above for the function g726_reconst.

5. Function g726_sync. This function implements the synchronous coding adjustment. Since it makes use of the transmitted quantization index *i, it is modified to handle the case when only one description is received.

6. Functions g726_tone and g726_trans. These functions implement a tone and transition detector. The detector is disabled in the illustrative embodiment, since only speech signals are considered. Moreover, disabling the detector tends to lead to better decoding quality.

The illustrative embodiment can be implemented using otherwise conventional processing and memory elements in the multiple description coder 110 and decoder 120. Such elements may include, e.g., a microprocessor, an application specific integrated circuit (ASIC) or another type of digital data processor operating in conjunction with one or more software programs stored in an electronic memory or other storage device. For example, the index assignment tables described above can be stored in this manner and utilized by a digital data processor to implement the corresponding processing functions.

It should again be emphasized that the above-described embodiment of the invention is intended to be illustrative only. Alternative embodiments of the invention may utilize other system configurations and arrangements of processing elements. For example, the invention does not require the use of ADPCM or any particular type of frequency hopping. Moreover, the invention may be used for a wide variety of different types of input signals, and in numerous multiple description coding applications other than those described herein. These and numerous other alternative embodiments within the scope of the following claims will be apparent to those skilled in the art.

What is claimed is:

1. A method of processing a signal for transmission in a wireless communication system, the method comprising the steps of:

encoding the signal in a multiple description coder which generates a plurality of different descriptions of a given portion of the signal;

arranging the different descriptions of the given portion of the signal into packets such that at least a first description of the given portion is placed in a first packet and a second description of the given portion is placed in a second packet; and transmitting each of the packets using a frequency hopping modulator, wherein a hopping rate of the modulator is configured based at least in part on a number of descriptions generated for each of a plurality of different portions of the signal;

wherein the hopping rate of the frequency hopping modulator is selected such that a transmission delay of the system is not increased as a result of the transmission of the plurality of descriptions relative to a transmission delay of the system for single description transmission.

2. The method of claim 1 wherein the multiple description coder comprises a multiple description coder configured to implement multiple description scalar quantization (MDSQ).

3. The method of claim 1 wherein the multiple description coder comprises a multiple description adaptive differential pulse code modulation (ADPCM) coder.

4. The method of claim 1 wherein each of the portions of the signal corresponds to a designated segment of the signal having a particular time duration.

5. The method of claim 1 wherein the signal comprises a speech signal.

6. The method of claim 1 wherein the wireless communication system comprises a cordless telephone system.

7. The method of claim 1 wherein the frequency hopping modulator is configured such that each of the packets is transmitted using a different frequency.

8. A method of processing a signal for transmission in a wireless communication system, the method comprising the steps of:

encoding the signal in a multiple description coder which generates a plurality of different descriptions of a given portion of the signal;

arranging the different descriptions of the given portion of the signal into packets such that at least a first description of the given portion is placed in a first packet and a second description of the given portion is placed in a second packet; and transmitting each of the packets using a frequency hopping modulator, wherein a hopping rate of the modulator is configured based at least in part on a number of descriptions generated for each of a plurality of different portions of the signal;

wherein the hopping rate of the frequency hopping modulator is selected as twice a frequency hopping rate of the modulator used for transmission of a single description of the given portion of the signal.

9. A method of processing a signal for transmission in a wireless communication system, the method comprising the steps of:

encoding the signal in a multiple description coder which generates a plurality of different descriptions of a given portion of the signal;

arranging the different descriptions of the given portion of the signal into packets such that at least a first description of the given portion is placed in a first packet and a second description of the given portion is placed in a second packet; and transmitting each of the packets using a frequency hopping modulator, wherein a hopping rate of the modulator is configured based at least in part on a number of descriptions generated for each of a plurality of different portions of the signal;

wherein a packet size for the first and second packets is selected as one-half a packet size used for transmission of a single description of the given portion of the signal.

10. A method of processing a signal for transmission in a wireless communication system, the method comprising the steps of:

encoding the signal in a multiple description coder which generates a plurality of different descriptions of a given portion of the signal;

arranging the different descriptions of the given portion of the signal into packets such that at least a first description of the given portion is placed in a first packet and a second description of the given portion is placed in a second packet; and transmitting each of the packets using a frequency hopping modulator, wherein a hopping rate of the modulator is configured based at least in part on a number of descriptions generated for each of a plurality of different portions of the signal;

wherein the encoding step generates two descriptions for each of a plurality of different portions of the signal, with a first one of the descriptions for a current one of the portions of the signal being placed in a current packet along with a second one of the descriptions for a previous portion of the signal.

11. An apparatus for processing a signal for transmission in a wireless communication system, the apparatus comprising:

a multiple description coder operative to generate a plurality of different descriptions of a given portion of the signal, the different descriptions of the given portion of the signal being arranged into packets such that at least a first description of the given portion is placed in a first packet and a second description of the given portion is placed in a second packet; and a frequency hopping modulator having an input coupled to an output of the multiple description coder and operative to configure the packets for transmission, wherein a hopping rate of the modulator is configured based at least in part on a number of descriptions generated for each of a plurality of different portions of the signal;

wherein the hopping rate of the frequency hopping modulator is selected such that a transmission delay of the system is not increased as a result of the transmission of the plurality of descriptions relative to a transmission delay of the system for single description transmission.

12. The apparatus of claim 11 wherein the multiple description coder comprises a multiple description coder configured to implement multiple description scalar quantization (MDSQ).

13. The apparatus of claim 11 wherein the multiple description coder comprises a multiple description adaptive differential pulse code modulation (ADPCM) coder.

14. The apparatus of claim 11 wherein each of the portions of the signal corresponds to a designated segment of the signal having a particular time duration.

15. The apparatus of claim 11 wherein the signal comprises a speech signal.

16. The apparatus of claim 11 wherein the wireless communication system comprises a cordless telephone system.

17. The apparatus of claim 11 wherein the frequency hopping modulator is configured such that each of the packets is transmitted using a different frequency.

18. An apparatus for processing a signal for transmission in a wireless communication system, the apparatus comprising:

a multiple description coder operative to generate a plurality of different descriptions of a given portion of the signal, the different descriptions of the given portion of the signal being arranged into packets such that at least a first description of the given portion is placed in a first packet and a second description of the given portion is placed in a second packet; and a frequency hopping modulator having an input coupled to an output of the multiple description coder and operative to configure the packets for transmission, wherein a hopping rate of the modulator is configured based at least in part on a number of descriptions generated for each of a plurality of different portions of the signal;

wherein the hopping rate of the frequency hopping modulator is selected as twice a frequency hopping rate of the modulator used for transmission of a single description of the given portion of the signal.

19. An apparatus for processing a signal for transmission in a wireless communication system, the apparatus comprising:

a multiple description coder operative to generate a plurality of different descriptions of a given portion of the signal, the different descriptions of the given portion of the signal being arranged into packets such that at least a first description of the given portion is placed in a first packet and a second description of the given portion is placed in a second packet; and a frequency hopping modulator having an input coupled to an output of the multiple description coder and operative to configure the packets for transmission, wherein a hopping rate of the modulator is configured based at least in part on a number of descriptions generated for each of a plurality of different portions of the signal;

wherein a packet size for the first and second packets is selected as one-half a packet size used for transmission of a single description of the given portion of the signal.

20. An apparatus for processing a signal for transmission in a wireless communication system, the apparatus comprising:

a multiple description coder operative to generate a plurality of different descriptions of a given portion of the signal, the different descriptions of the given portion of the signal being arranged into packets such that at least a first description of the given portion is placed in a first packet and a second description of the given portion is placed in a second packet; and a frequency hopping modulator having an input coupled to an output of the multiple description coder and operative to configure the packets for transmission, wherein a hopping rate of the modulator is configured based at least in part on a number of descriptions generated for each of a plurality of different portions of the signal;

wherein the multiple description coder generates two descriptions for each of a plurality of different portions of the signal, with a first one of the descriptions for a current one of the portions of the signal being placed in a current packet along with a second one of the descriptions for a previous portion of the signal.

* * * * *